(12) United States Patent
Aikala

(10) Patent No.: US 10,485,183 B2
(45) Date of Patent: Nov. 26, 2019

(54) LIGHTING ASSEMBLY

(71) Applicant: VALOYA OY, Helsinki (FI)

(72) Inventor: Lars Aikala, Helsinki (FI)

(73) Assignee: VALOYA OY, Helsinki (FI)

( * ) Notice: Subject to any disclaimer, the term of this patent is extended or adjusted under 35 U.S.C. 154(b) by 0 days.

(21) Appl. No.: 15/341,406

(22) Filed: Nov. 2, 2016

(65) Prior Publication Data

US 2017/0071135 A1     Mar. 16, 2017

Related U.S. Application Data

(62) Division of application No. 13/390,370, filed as application No. PCT/FI2010/050716 on Sep. 16, (Continued)

(30) Foreign Application Priority Data

Sep. 18, 2009 (FI) ................................. 20095967

(51) Int. Cl.
A01G 7/00 (2006.01)
A01G 7/04 (2006.01)
(Continued)

(52) U.S. Cl.
CPC ............... A01G 7/045 (2013.01); F21K 9/00 (2013.01); F21K 9/64 (2016.08); H01L 25/0753 (2013.01); H01L 33/50 (2013.01); H01L 33/507 (2013.01); H01L 33/54 (2013.01); H01L 33/62 (2013.01); H05B 33/0857 (2013.01); *F21Y 2101/00* (2013.01); *F21Y 2115/10* (2016.08);
(Continued)

(58) Field of Classification Search
None
See application file for complete search history.

(56) References Cited

U.S. PATENT DOCUMENTS 3,544,482 A    12/1970  Barry
4,055,781 A *  10/1977  Schreurs ................ C09K 11/66
                                                        313/487
(Continued)

FOREIGN PATENT DOCUMENTS

CN    101353576       1/2009
CN    201228867 Y    4/2009
(Continued)

OTHER PUBLICATIONS

International Search Report dated Oct. 28, 2011, corresponding to PCT/FI2010/050716.
(Continued)

*Primary Examiner* — Andrew J Coughlin
(74) *Attorney, Agent, or Firm* — Young & Thompson

(57) ABSTRACT

A lighting fixture for facilitating plant growth and a light emitting component. The fixture includes a single light emission source LED device which provides at least two emission peaks in the wavelength range of 300-800 nm and at least one of the emission peaks has Full Width of Half Maximum (FWHM) at least 50 nm or higher. The emission peaks of the LED match well with a plant photosynthesis response spectrum and is therefore particularly suitable for high efficiency artificial lighting.

12 Claims, 6 Drawing Sheets

Related U.S. Application Data 2010, now Pat. No. 9,516,818, which is a division of application No. 12/797,215, filed on Jun. 9, 2010, now Pat. No. 8,549,787.

(60) Provisional application No. 61/243,613, filed on Sep. 18, 2009.

(51) Int. Cl.

| | |
|---|---|
| *F21K 9/00* | (2016.01) |
| *H01L 25/075* | (2006.01) |
| *H05B 33/08* | (2006.01) |
| *F21K 9/64* | (2016.01) |
| *H01L 33/50* | (2010.01) |
| *H01L 33/54* | (2010.01) |
| *H01L 33/62* | (2010.01) |
| *H01L 33/60* | (2010.01) |
| *F21Y 101/00* | (2016.01) |
| *F21Y 115/10* | (2016.01) |

(52) U.S. Cl.
CPC .......... *H01L 33/502* (2013.01); *H01L 33/504* (2013.01); *H01L 33/60* (2013.01); *H01L 2924/0002* (2013.01); *Y02P 60/149* (2015.11)

(56) References Cited

U.S. PATENT DOCUMENTS

| | | | |
|---|---|---|---|
| 5,012,609 | A | 5/1991 | Ignatius et al. |
| 6,686,691 | B1 | 2/2004 | Mueller et al. |
| 6,921,182 | B2 | 7/2005 | Anderson, Jr. et al. |
| 7,414,272 | B2 | 8/2008 | Hiramatsu et al. |
| 8,148,887 | B2 | 4/2012 | Hirosaki et al. |
| 8,395,311 | B2 | 3/2013 | Morimoto |
| 2002/0154504 | A1 | 10/2002 | Fang et al. |
| 2006/0006820 | A1 | 1/2006 | Roseman et al. |
| 2006/0285324 | A1 | 12/2006 | Ansems et al. |
| 2007/0075629 | A1 | 4/2007 | Le Toquin et al. |
| 2007/0159066 | A1 | 7/2007 | Cheetham et al. |
| 2007/0159091 | A1 | 7/2007 | Hirosaki et al. |
| 2008/0173886 | A1 | 7/2008 | Cheon et al. |
| 2008/0302004 | A1 | 12/2008 | Lin |
| 2009/0231832 | A1 | 9/2009 | Zukauskas et al. |
| 2009/0303694 | A1 | 12/2009 | Roth et al. |
| 2010/0050499 | A1 | 3/2010 | Liang |
| 2010/0232135 | A1 | 9/2010 | Munehiro et al. |
| 2010/0237766 | A1* | 9/2010 | Baumgartner .......... F21K 9/232 313/498 |
| 2012/0124903 | A1 | 5/2012 | Takeuchi |

FOREIGN PATENT DOCUMENTS

| | | |
|---|---|---|
| EP | 1616930 | 1/2006 |
| EP | 2025220 | 2/2009 |
| EP | 2056364 | 5/2009 |
| JP | 8103167 | 4/1996 |
| JP | 2001-275488 A | 10/2001 |
| JP | 2002027831 | 1/2002 |
| JP | 2002281830 | 10/2002 |
| JP | 2004000093 | 1/2004 |
| JP | 2005235934 | 9/2005 |
| JP | 2006028310 | 2/2006 |
| JP | 2008-181771 | 8/2008 |
| JP | 2008-283155 | 11/2008 |
| JP | 2011155948 | 8/2011 |
| TW | 200807753 A | 2/2008 |
| WO | 2005022030 | 3/2005 |
| WO | 2006/061728 A2 | 6/2006 |
| WO | 2006/061728 A3 | 6/2006 |
| WO | 2007093607 | 8/2007 |
| WO | 2007/114614 A1 | 11/2007 |
| WO | 2008078277 | 7/2008 |
| WO | 2008137977 | 11/2008 |
| WO | 2009000282 | 12/2008 |
| WO | 2009/022016 A1 | 2/2009 |
| WO | 2009/055079 A1 | 4/2009 |
| WO | 2009066780 | 5/2009 |
| WO | 2009141287 | 11/2009 |
| WO | 2010053341 | 5/2010 |

OTHER PUBLICATIONS

Finnish Search Report dated Apr. 30, 2010, corresponding to the Foreign Priority Application No. 20095967.
Chinese Office Action dated Jun. 19, 2013, from corresponding CN application.
Japanese Office Action dated Jul. 16, 2013, from corresponding JP application.
Fattori et al., "Organic light sources look forward to optimize the photosynthesis process", Photonics and Nanostructures—Fundamentals and Applications, 2008, vol. 6, pp. 225-230.
US Department of Energy's Office, "Lifetime of White LEDs", Building Technologies Program, Energy Efficiency and Renewable Energy, 2007, http://www.wpgamericas.com/WPGlighting/PDF/lifetime_white_leds_pdf.
Finnish Office Action, dated Jun. 6, 2014, from corresponding FI application.
Liang MA et al: "Investigation of Eu—Mn energy transfer in A3MgSi2O8:Eu2+, Mn2+ (A=Ca,Sr,Ba) for light-emitting diodes for plant cultivation", Applied Physics Letters, American Institute of Physics, 2 Huntington Quadrangle Melville, NY 11747, vo 1.93, No. 14, Oct. 6, 2008 (Oct. 6, 2008), pp. 144101-14111, XP002658425, ISSN: 0003-6951 Cited in EP SR.
European Search Report dated Feb. 25, 2016, in corresponding European Application.
Smith, H., "Phytochromes and Light Signal Perception by Plants—an Emerging Synthesis," Nature, vol. 407, 2000, pp. 585-591.
Australian Office Action issued in Application No. 2015203695, dated Nov. 9, 2017.
Indian Office Action for Application No. 354/MUMNP/2012, dated Jun. 19, 2018, with English translation provided.
Japanese Office Action for Application No. 2017-078013, dated May 7, 2018, with English translation provided.
Australian Office Action issued in Application No. 2015203695, dated Mar. 16, 2018.
Extended European Search Report for Application No. 18208861.7 dated May 27, 2019.
Paulo Pinho, Dissertation "Usage and Control of Solid-State Lighting for Plant Growth," Helsinki University of Technology, Department of Electronics, Lighting Unit, Espoo 2008.
Office Action in Chinese Patent Application No. 201710160504.3 dated Aug. 2, 2019 with English translation provided.

* cited by examiner

LIGHTING ASSEMBLY

BACKGROUND OF THE INVENTION

Field of the Invention

The present invention relates to the use of LEDs in horticultural lighting applications. In particular, the present invention concerns a lighting fixture for facilitating plant growth comprising at least one Light Emitting Diode (LED) having spectral characteristics including a peak in the wavelength range from 600 to 700 nm. The present invention also concerns novel light emitting components which are particularly suitable for facilitating plant growth and comprising a light emitting compound semiconductor chip.

Description of Related Art

On the Earth the sun is the main source of visible (i.e. light) and invisible electromagnetic radiation and the main factor responsible for the existence of life. The net daily average solar energy reaching the Earth is approximately $28 \times 10^{23}$ J (i.e. 265 EBtu). This value is 5500 times higher than the world's annual primary energy consumption, estimated in 2007 to be 479 PBtu. The spectral distribution of the sun's radiation, as it can be measured at the earth's surface, has a broad wavelength band of between around 300 nm and 1000 nm.

However, only 50% of the radiation reaching the surface is photosynthetically active radiation (PAR). PAR, according to the CIE (Commission Internationale de L'Eclairage) recommendations comprises the wavelength region of between 400 nm and 700 nm of the electromagnetic spectrum. The laws of photochemistry can generally express the way that plants harvest radiation. The dual character of radiation makes it behave as an electromagnetic wave when propagating in space and as particles (i.e. photon or quantum of radiant energy) when interacting with matter. The photoreceptors are the active elements existing mainly on plant's leaves responsible for the photon capture and for conversion of its energy into chemical energy.

Due to the photochemical nature of photosynthesis, the photosynthetic rate, which represents the amount of $O_2$ evolution or the amount of $CO_2$ fixation per unit time, correlates well with the number of photons falling per unit area per second on a leaf surface. Therefore, the recommended quantities for PAR are based on the quantum system and are expressed using the number of moles (mol) or micromoles (µmol) of photons. The recommended term to report and quantify instantaneous measurements of PAR is the photosynthetic photon flux density (PPFD), and is typically expressed in µmoles/m²/s. This gives the number of moles of photons falling at a surface per unit area per unit time. The term photosynthetic photon flux (PPF) is also frequently used to refer to the same quantity.

Photoreceptors existing in living organisms such as plants use the radiant energy captured to mediate important biologic processes. This mediation or interaction can take place in a variety of ways. Photosynthesis together with photoperiodism, phototropism and photomorphogenesis are the four representative processes related to interaction between radiation and plants. The following expression shows the simplified chemical equation of photosynthesis:

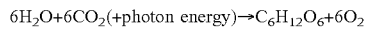

$$6H_2O + 6CO_2 (+\text{photon energy}) \rightarrow C_6H_{12}O_6 + 6O_2$$

As will appear from the equation, carbohydrates, such as sugar glucose ($C_6H_{12}O_6$), and oxygen ($O_2$), are the main products of the photosynthesis process. These are synthesized from carbon dioxide ($CO_2$) and water ($H_2O$) using the energy of the photons harnessed by using specialised photoreceptors such as chlorophylls and converted into chemical energy.

Through photosynthesis, the radiant energy is also used as the primary source of chemical energy, which is important for the growth and development of plants. Naturally, the input-output reactant balance of the equation is also dependent on the quantity (i.e. number of photons) and quality (i.e. energy of the photons) of the radiant energy and, consequently, also of the produced biomass of the plants. "Photoperiodism" refers to the ability that plants have to sense and measure the periodicity of radiation, phototropism to the growth movement of the plant towards and away from the radiation, and photomorphogenesis to the change in form in response to the quality and quantity of radiation.

The typical absorption spectra of the most common photosynthetic and photo-morphogenetic photoreceptors, such as chlorophyll a, chlorophyll b and betacarotene, and the two interconvertable forms of phytochromes (Pfr and Pr) are presented in FIG. 1.

The photomorphogenetic responses, contrary to photosynthesis, can be achieved with extremely low light quantities. The different types of photosynthetic and photo-morphogenetic photoreceptors can be grouped in at least three known photosystems: photosynthetic, phytochrome and cryptochrome or blue/UV-A (ultraviolet-A).

In the photosynthetic photosystem, the existing pigments are chlorophylls and carotenoids. Chlorophylls are located in the chloroplasts' thylakoids located in the leaf mesophyll cells of plants. The quantity or the energy of the radiation is the most significant aspect, since the activity of those pigments is closely related to the light harvest. The two most important absorption peaks of chlorophyll are located in the red and blue regions from 625 to 675 nm and from 425 to 475 nm, respectively. Additionally, there are also other localized peaks at near-UV (300-400 nm) and in the far-red region (700-800 nm). Carotenoids such as xanthophylls and carotenes are located in the chromoplast plastid organelles on plant cells and absorb mainly in the blue region.

The phytochrome photosystem includes the two interconvertable forms of phytochromes, Pr and Pfr, which have their sensitivity peaks in the red at 660 nm and in the far-red at 730 nm, respectively. Photomorphogenetic responses mediated by phytochromes are usually related to the sensing of the light quality through the red (R) to far-red (FR) ratio (R/FR). The importance of phytochromes can be evaluated by the different physiological responses where they are involved, such as leaf expansion, neighbour perception, shade avoidance, stem elongation, seed germination and flowering induction. Although shade-avoidance response is usually controlled by phytochromes through the sensing of R/FR ratio, the blue-light and PAR level is also involved in the related adaptive morphological responses.

Blue- and UV-A (ultraviolet A)-sensitive photoreceptors are found in the cryptochrome photosystem. Blue light absorbing pigments include both cryptochrome and phototropins. They are involved in several different tasks, such as monitoring the quality, quantity, direction and periodicity of the light. The different groups of blue- and UV-A-sensitive photoreceptors mediate important morphological responses such as endogenous rhythms, organ orientation, stem elongation and stomatal opening, germination, leaf expansion, root growth and phototropism. Phototropins regulate the pigment content and the positioning of photosynthetic organs and organelles in order to optimize the light harvest and photoinhibition. As with exposure to continuous far-red radiation, blue light also promotes flowering through the mediation of cryptochromes photoreceptors. Moreover, blue-light-sensitive photoreceptors (e.g.flavins and carotenoids) are also sensitive to the near-ultraviolet radiation, where a localized sensitivity peak can be found at around 370 nm Cryptochromes are not only common to all plant species. Cryptochromes mediate a variety of light responses, including the entrainment of the circadian rhythms in flowering plants such as the *Arabidopsis*. Although radiation of wavelengths below 300 nm can be highly harmful to the chemical bonds of molecules and to DNA structure, plants absorb radiation in this region also. The quality of radiation within the PAR region may be important to reduce the destructive effects of UV radiation. These photoreceptors are the most investigated and therefore their role in control of photosynthesis and growth is known reasonably well. However, there is evidence of the existence of other photoreceptors, the activity of which may have an important role in mediating important physiological responses in the plant. Additionally, the interaction and the nature of interdependence between certain groups of receptors are not well understood.

Photosynthesis is perhaps one of the oldest, most common and most important biochemical process in the world. The use of artificial light to substitute or compensate the low availability of daylight is a common practice, especially in northern countries during the winter season, for production of vegetable and ornamental crops.

The time of artificial electric lighting started with the development by Thomas Edison in 1879 of Edison's bulb, commonly known today as the incandescent lamp. Due to its thermal characteristic, incandescence is characterised by a large amount of farred emission, which can reach approximately 60% of the total PAR. In spite of the developments that have taken place over more than a century, the electrical efficiency of incandescent lamps, given by the conversion efficiency between electrical energy consumed (input) and optical energy emitted (output) within the visible spectral region, is still very poor. Typically it is around 10%. Incandescent light sources suffer also low lifetime performances, typically lifetime is not longer than 1000 hours. In plant-growth applications their use is limited.

Growth of ornamental plants is one of the applications where incandescent lamps can still be used. Floral initiation can be achieved with long day responsive species using overnight exposure to low photon fluence rates using incandescent lamps. The high amount of far-red radiation emitted is used to control the photomorphogenetic responses throughout the mediation of the phytochromes.

Fluorescent lamps are more commonly utilized in plant-growth applications than incandescent lamps. The electro-optical energy conversion is more efficient in comparison to incandescent lamps. Tubular type fluorescent lamps can achieve electrical efficiency values from typically around 20% to 30%, where more than 90% of the emitted photons are inside the PAR region with typical lifetimes of around 10000 hours. However, especially designed long-lifetime fluorescent lamps can reach lifetimes of between 30000 hours. Besides their reasonable energy efficiency and lifetime, another advantage of fluorescent lamps in plant growth is the amount of blue radiation emitted. This can reach more than 10% of the total photon emission inside PAR, depending on the correlated colour temperature (CCT) of the lamp. For this reason, fluorescent lamps are frequently used for total substitution of natural daylight radiation in close growth rooms and chambers. The blue radiation emitted is indispensable to achieve a balanced morphology of most crop plants through the mediation of the cryptochrome family of photoreceptors.

The metal halide lamp belongs to the group of high-intensity discharge lamps. The emission of visible radiation is based on the luminescent effect. The inclusion of metal halides during manufacture allows to a certain extent the optimization of the spectral quality of the radiation emitted. Metal halide lamps can be used in plant growth to totally replace daylight or for partially supplementing it during the period of lower availability. The high PAR output per lamp, the relatively high percentage of blue radiation around 20% and the electrical efficiency of approximately 25%, makes metal halide lamps an option for year-round crop cultivation. Their operation times are typically 5,000 to 6,000 hours. The high-pressure sodium (HPS) lamp has been the preferred light source for year-round crop production in greenhouses. The main reasons have been the high radiant emission, low price, long life time, high PAR emission and high electrical efficiency. These factors have allowed the use of high-pressure sodium lamps as supplemental lighting sources supporting vegetative growth in a cost-effective way during wintertime in northern latitudes.

However, the spectral quality in HPSs lamps is not optimal for promoting photosynthesis and photomorphogenesis, resulting in excessive leaf and stem elongation. This is due to the unbalanced spectral emission in relation to the absorption peaks of important photosynthetic pigments such as chlorophyll a, chlorophyll b and betacarotene. The low R/FR ratio and low blue light emission in comparison with other sources induces excessive stem elongation to most of the crops grown under HPS lighting. Electrical efficiencies of high-pressure sodium lamps are typically within 30% and 40%, which make them the most energy-efficient light sources used nowadays in plant growth. Approximately 40% of the input energy is converted into photons inside the PAR region and almost 25% to 30% into far-red and infra red. The operation times of high pressure sodium lamps are in the range from about 10,000 to 24,000 hours.

The low availability of daylight in northern latitudes and the demand of consumers for quality horticultural products at affordable prices year-round set demands for new lighting and biological technologies. Also production yields globally can be significantly increased if daylight is available up 20 to 24 hours per day. Therefore, approaches that can reduce production costs, increase yields and quality of the crops are needed. Lighting is just one of the aspects involved that can be optimized. However, its importance cannot be underestimated. The increase in electricity prices and the need to reduce $CO_2$ emissions are additional reasons to make efficient use of energy. In year-round crop production in greenhouses, the electricity cost contribution to overhead costs may reach in some crops approximately 30%.

Although existing light sources commonly used for plant growth may have electrical efficiencies close to 40%, the overall system efficiency (i.e. including losses in drivers, reflectors and optics) can be significantly lower. The spectral quality of the radiation plays an important role in the healthy growth of the crop. The conventional light sources cannot be spectrally controlled during its utilization without the inefficient and limited utilization of additional filters. Moreover, the control of the radiation quantity is also limited, reducing the possibility of versatile lighting regimes such as pulsed operation.

Therefore, and for reasons relating to the previously described aspects, the light-emitting diode and related solid-state lighting (SSL) have emerged as potentially viable and promising tools to be used in horticultural lighting. Internal quantum efficiency of LEDs is a measure for the percentage of photons generated by each electron injected into the active region. In fact, the best AlInGaP red and AlInGaN green and blue HB-LEDs can have internal quantum efficiencies better than 50%; still challenges remain to extract all generated light out of the semiconductor device and the light fixture.

In horticultural lighting the main practical advantages of LED-based light sources in relation to conventional light sources is the directionality and full controllability of the emitted radiation. LEDs do not necessarily require reflectors, as they are naturally halfisotropic emitters. LEDs as directional emitters avoid most of the losses associated with the optics. Additionally, the narrow spectral bandwidth characteristic of coloured LEDs is another important advantage in relation to conventional broad waveband light sources. The main advantage of using LEDs as photosynthetic radiation sources results from the possibility of selecting the peak wavelength emission that most closely matches the absorption peak of a selected photoreceptor. In fact, this possibility brings with it additional advantages. The efficient usage of the radiant energy by the photoreceptor on the mediation of a physiological response of the plant is one of the advantages. Another advantage is the controllability of the response by fully controlling the radiation intensity.

The advantages mentioned previously can be further extended to the luminaire level. The inventor is aware of a luminaire with a blue LED and a red LED, see, e.g., P. Pinho, Doctoral dissertation "*Usage and control of solid-state lighting for plant growth*", Helsinki University of Technology, Department of Electronics, 2008. The spectral emission of currently coloured AlInGaN LEDs are available from UV into to the green region of the visible spectrum. Those devices can emit in the blue and UV-A region where the absorption peaks of cryptochromes and carotenoids are located.

Chlorophyll a and the red isomeric form of phytochromes (Pr) have a strong absorption peak located around 660 nm AlGaAs LEDs emit in the same region but, partially due to low market demand and outdated technology of production, they are expensive devices if compared with phosphide or even nitride-based LEDs. AlGaAs LEDs can be also used to control the far-red form of phytochromes (Pfr), which has an important absorption peak at 730 nm.

AlInGaP LEDs are based on a well-established material technology with the relatively high optical and electrical performance. Typically, the characteristic spectral emission region of AlInGaP red LEDs covers the region where chlorophyll b has its absorption peak, around 640 nm Therefore, AlInGaP LEDs are also useful in promoting photosynthesis.

The novel commercial high brightness LEDs are not suitable for greenhouse cultivation as their main emission peak lies in the range of green wavelengths extending from 500 to 600 nm and thus not responding to photosynthesis process. However, in principle according to the art a LED light to which the photosynthesis responds can be constructed combining various types of semiconductor LEDs such as AlInGaP and AlInGaN, for red and blue colors.

There are a number of problems related to the combination of individually colored LEDs. Thus, different types of semiconductor devices will age at different rates and for this reason the ratio of red colour to blue color will vary over time, resulting further in abnormalities in a plant growth process. A second major issue is that individual single color LEDs have relatively narrow spectral coverage, typically less than 25 nm, which is insufficient for providing good photosynthesis efficiency without utilizing very high number of different color and individual LEDs and causing high cost of implementation.

It is known from EP 2056364 A1 and US 2009/0231832 that an enhanced number of colors can be generated from LEDs using wavelength conversion materials, such as phosphor, to re-emit different colors of light. Allegedly, the different colors replicating sunlight can be used to treat depression or seasonal disease according to US 2009/0231832. These documents are cited here as reference.

These lights have many disadvantages, even if they were to be used as horticultural lights, for example due to the simple reason that the spectrum of sunlight is suboptimal for plant growth. The light of US 2009/0231832 that aims to replicate sunlight contains many superfluous wavelengths that are not used efficiently by plants in their growth. For example the band of 500-600 nm (green light) is poorly used by plants as green plants reflect this wavelength. This leads to wasted energy in horticultural applications.

Furthermore, the lights of the prior art also omit essential wavelengths, which would be very useful for plant growth. For example, these lights do not reach to far red between 700 nm-800 nm, which is important to plant cultivation.

SUMMARY OF THE INVENTION

It is an aim of the present invention to eliminate at least a part of the problems relating to the art and to provide a new way of facilitating plant growth using LEDs.

It is a first objective of the invention to provide a single light emission source based LED device to which the photosynthesis process responds well.

It is a second objective of the invention to provide a lighting fixture for greenhouse cultivation based on a photosynthesis photon flux (PPF) optimized LED device.

It is a third objective of the invention to achieve an LED device that provides at least two emission peaks in the wavelength range from 300 to 800 nm and at least one of the emission peaks has Full Width of Half Maximum (FWHM) of at least 50 nm or more.

It is a fourth objective of the invention to provide LED based greenhouse cultivation lighting fixture wherein the emission intensity ratio of two emission frequencies, 300-500 nm and 600-800 nm, are reduced with less than 20% during the 10,000 hours of operation.

It is a fifth objective of the invention to provide a technical solution giving a better PPF value per Watt (i.e. PPFs against used power wattage) than attained by a conventional high pressure sodium lamp normally used in greenhouse cultivation and thus providing an energy efficient light source for greenhouse cultivation process and artificial lighting used therein.

It is a sixth objective of the invention to provide a single light emission source wherein the emission at a frequency of 300-500 nm is generated by the semiconductor LED chip and the emission at a frequency of 600-800 nm is generated using a partial wavelength up-conversion of the LED chip radiation power. The inventor has discovered that for example cucumber and lettuce plants reach greater length and/or mass when illuminated with the inventive horticultural light that includes far red light (700-800 nm).

It is a seventh objective of the invention to provide a single light emission source where the emission at frequency of 300-500 nm is generated by the semiconductor LED chip and the emission at frequency of 600-800 nm is generated using a partial wavelength up-conversion of the LED chip radiation power. The wavelength up-conversion to produce 600-800 nm radiation is achieved by using one or more wavelength up-conversion materials in proximity with the LED emission source.

In this application "up-conversion" is construed as changing the wavelength of incoming absorbed light to emitted light of longer wavelengths.

It is an eighth objective of the invention to provide 400-500 nm, 600-800 nm or both frequency ranges partial or complete wavelength up-conversion of semiconductor LED chip radiation, the chip having emission at 300-500 nm range emission range. The wavelength up-conversion is realized by using either organic, inorganic or combination of both types of materials.

It is a ninth objective of the invention to provide the wavelength up-conversion using nano-sized particle material for the up-conversion.

It is a tenth objective of the invention to provide the wavelength up-conversion using molecular like material for the up-conversion.

It is an eleventh objective of the invention to provide the wavelength up-conversion using a polymeric material wherein the up-conversion material is covalently bonded to the polymer matrix providing the wavelength up-conversion.

It is a twelfth objective of the invention to present a LED based lighting fixture where the spectral band 500-600 nm is suppressed. In this suppressed band there is hardly any or no emission at all, or in any case less emission than in either of the adjacent bands 400-500 nm, 600-700 nm. The suppression can be achieved in accordance with the invention by not having any or only a small amount of primary emission in the band 400-500 nm, and by making sure that any up-conversion causes a wavelength shift that shifts the wavelength beyond 600 nm. It is generally known that green plants can not utilize green light (500-600 nm) radiation as well as the radiation in the adjacent bands, as this radiation merely reflects from the plant rather than is being absorbed for photosynthetic conversion.

It is a thirteenth objective of the invention to present a LED based lighting fixture that maximizes anabolic growth of plants by providing desired far-red light, whereas it minimizes green light which from the perspective of plant cultivation is radiation that wastes energy. This objective is realized in one aspect of the invention by a blue LED with a wavelength up-conversion device which up-converts part of the emitted blue light (300-500) nm into a broad red spectrum component (600-800 nm) which has a far-red component, but omits and/or minimizes the green component (500-600 nm).

The present invention provides a light emitting diode and a related light fixture suitable for greenhouse cultivation. According to the invention, the light emitting diode has a specific emission frequency pattern, viz. it has at least two spectral characteristics; one emission peak with a full width of half maximum of at least 50 nm or more and having a peak wavelength in the range of 600 to 700 nm, and a second spectral characteristics having a peak wavelength below 500 nm range. The emission peaks of the LED match well with a plant photosynthesis response spectrum and is therefore particularly suitable for high efficiency artificial lighting.

A light emitting component suitable for facilitating plant growth, comprises a light emitting compound semiconductor chip; and a light wavelength up-conversion phosphor which is deposited in direct proximity of the LED chip. Such a component is capable of emitting two characteristic light emission peaks.

More specifically, the light fixture according to the invention is characterized by what is stated in the characterizing part of claim 1 and/or 2.

A lighting fixture for facilitating plant growth in accordance with the invention comprises at least one Light Emitting Diode (LED) having
a) first spectral characteristics including a peak in the wavelength range from 600 to 700 nm and arranged to exhibit a full width of half maximum of at least 50 nm or more; and
b) second spectral characteristics with a maximum of 50 nm full width of half maximum and arranged to exhibit a peak wavelength in the range from 440 to 500 nm.

A horticultural lighting fixture in accordance with the invention comprises at least one Light Emitting Diode (LED) having
a) first spectral characteristics including a peak in the wavelength range from 600 to 700 nm and arranged to exhibit a full width of half maximum of at least 50 nm or more;
b) second spectral characteristics with a maximum of 50 nm full width of half maximum and arranged to exhibit a peak wavelength in the range from 440 to 500 nm, and
c) all or part of the emission at a frequency of 600-800 nm is generated using a whole or partial wavelength up-conversion of the LED chip radiation power.

A horticultural lighting fixture in accordance with the invention comprises at least one Light Emitting Diode (LED) having
a) first spectral characteristics including a peak in the wavelength range from 600 to 700 nm and arranged to exhibit a full width of half maximum of at least 50 nm or more;
b) second spectral characteristics with a maximum of 50 nm full width of half maximum and arranged to exhibit a peak wavelength in the range from 440 to 500 nm, and
c) at least a part or the whole of the emission at wavelengths of 500-600 nm is arranged to be minimized and/or omitted and/or to be reduced below the intensity in 400-500 nm band and below the intensity in 600-700 nm band.

A lighting fixture for facilitating plant growth in accordance with the invention comprises a luminescent UV LED, optionally with external emission characteristics, said LED arranged to exhibit
a) first phosphorescent spectral characteristics with a peak wavelength in the range of 350 to 550 nm;
b) second optional phosphorescent spectral characteristics with a peak wavelength in the range of 600 to 800 nm;
c) third optional phosphorescent spectral characteristics with a peak wavelength freely adjustable between 350 and 800 nm;
d) the phosphorescent emission intensities of first, optional second and optional third spectral characteristics being adjustable in any ratio.

The light emitting component is characterized by what is stated in the characterizing part of claim 16 and/or 17.

A light emitting component for facilitating plant growth in accordance with the invention, comprises;
a light emitting compound semiconductor chip; and
a light wavelength up-conversion phosphor which is deposited in direct proximity of the LED chip;
said component being capable of emitting two characteristic light emission peaks.

A light emitting component of a horticultural light in accordance with the invention comprises;
a light emitting compound semiconductor chip; and a light wavelength up-conversion phosphor which is deposited in direct proximity of the LED chip;

said component being capable of emitting two characteristic light emission peaks, and all or part of the emission at a frequency of 600-800 nm is generated using a whole or partial wavelength up-conversion of the LED chip radiation power.

A light emitting component of a horticultural light in accordance with the invention comprises;

a light emitting compound semiconductor chip; and a light wavelength up-conversion phosphor which is deposited in direct proximity of the LED chip;

said component being capable of emitting two characteristic light emission peaks, and at least a part or the whole of the emission at wavelengths of 500-600 nm is arranged to be minimized and/or omitted and/or to be reduced below the intensity in 400-500 nm band and below the intensity in 600-700 nm band.

The best mode of the invention is considered to involve a plurality of LEDs in the wavelength range of 380-850 nm arranged with emission spectra that is arranged to coincide with the photosynthetic response of a plant to be cultivated with the lighting of the said LEDs. The best mode will feature wavelength up-conversion by phosphor from blue LED emission.

DETAILED DESCRIPTION OF PREFERRED EMBODIMENTS

Figure 1:
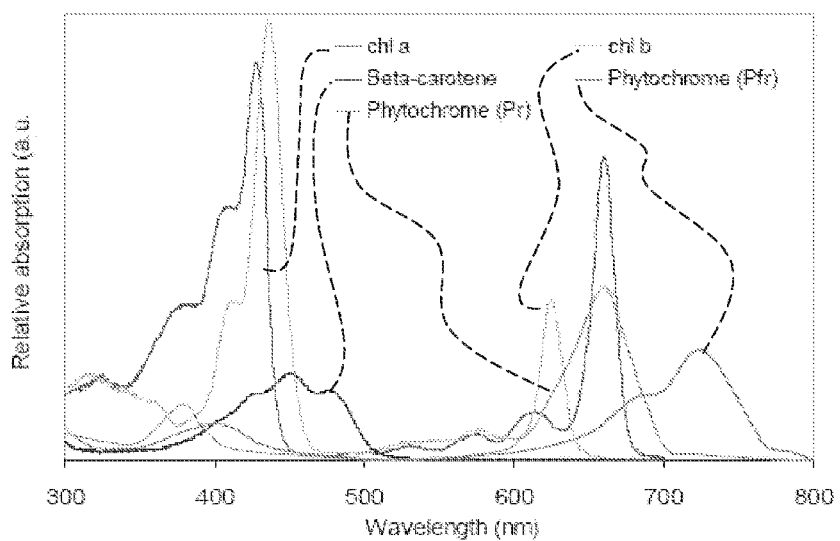
FIG. 1 shows relative absorption spectra of the most common photosynthetic and photomorphogenetic photoreceptors in green plants.

As already discussed above, the present invention relates in general to a single light emission source LED device that has optimal properties to be used as greenhouse cultivation light source. Specifically this approach to construct the light sources has optimal properties and flexibility for matching the photosynthesis frequencies in plant cultivation. By using this approach, the light sources can be designed to reach superior PPF and PPF per watt efficiency and performance and very low power consumption and very long operation lifetime when compared to the existing technologies.

In particular the single light emission source LED device provides at least two emission peaks in the wavelength range of 300-800 nm and at least one of the emission peaks has Full Width of Half Maximum (FWHM) at least 50 nm or higher. The emission peaks and relative intensities are selected to match the photosynthesis frequencies for the plant. Also the required PPF quantity for the light source is optimized to meet the plant requirement.

The emission at a frequency of 300-500 nm is generated by the semiconductor LED chip and the emission at frequency of 400-800 nm is generated using a complete or partial wavelength up-conversion of the LED chip radiation power. The partial wavelength up-conversion can be selected to be in range of 5-95%, preferably 35-65%, of the semiconductor LED chip radiation. The wavelength up-conversion to produce the 400-800 nm radiation is achieved by using one or more up-conversion materials in proximity with the LED emission source. The wavelength up-conversion is realized by using either organic, inorganic or combination of both types of materials. These materials can be particular (nano- or other size particles), molecular or polymeric materials. Furthermore the materials can have structural arrangement that results in wavelength up-conversion of the emission source.

According to one particular embodiment, a lighting fixture for facilitating plant growth comprises a UV LED, optionally with external luminescent emission characteristics. The LED exhibits typically a) first phosphorescent spectral characteristics with a peak wavelength in the range of 350 to 550 nm;

b) second optional phosphorescent spectral characteristics with a peak wavelength in the range of 600 to 800 nm; and c) third optional phosphorescent spectral characteristics with a peak wavelength freely adjustable between 350 and 800 nm.

In this application "adjustable" peak wavelength as in the above is construed as a peak wavelength that can be adjusted during assembly of the lighting fixture at the factory, and/or also "adjustable" as in an adjustable dial in the lighting fixture for on site peak wavelength adjustment. In addition adjusting the peak wavelengths of the LED during manufacturing process of the LED is also in accordance with the invention, and "adjustable" should be construed to also include adjustments made during the manufacturing process of the LED. All aforementioned embodiments of an adjustable peak wavelength, or any other adjustable light source or LED variable are within the scope of this patent application.

Preferably the phosphorescent emission intensities of first, optional second and optional third spectral characteristics are adjustable in any ratio.

FIGS. 2 to 5 illustrate a few examples of the emission peaks of the single light emission source LED devices.

Figure 2:
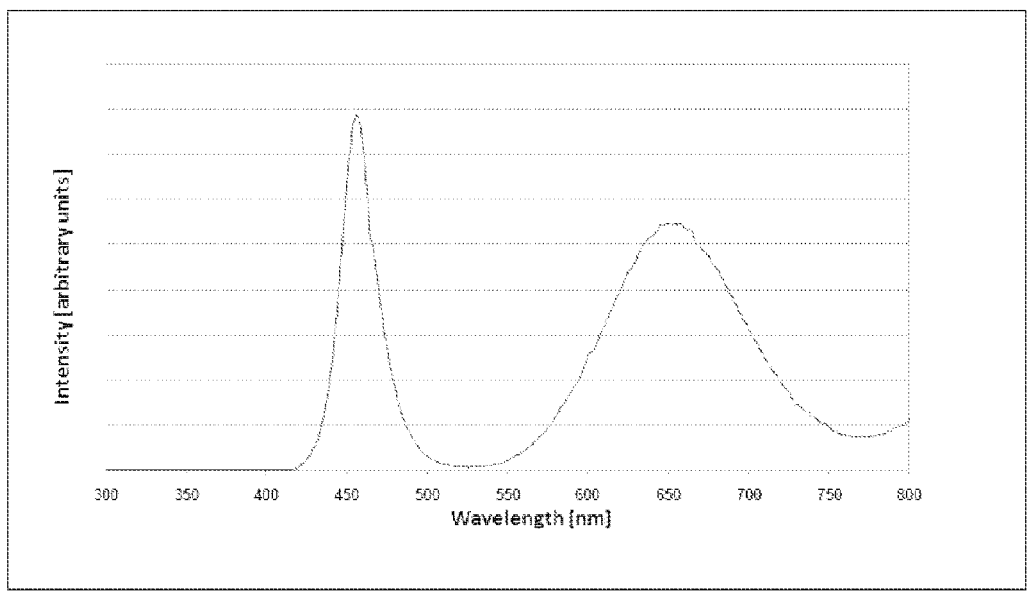
FIG. 2 shows the emission peaks of a first single light emission source LED device according to the invention.

In FIG. 2, the semiconductor LED chip emission frequency peaks at a wavelength of 457 nm with emission peaks Full Width of Half Maximum (FWHM) of 25 nm. In this case the wavelength up-conversion is done by using two up-conversion materials. These two wavelength up-conversion materials have individual emission peaks at 660 nm and 604 nm FIG. 2 shows the combined emission peak from these two wavelength up-conversion materials peaking at 651 nm wavelength with emission peaks FWHM of 101 nm. In this case about 40% (calculated from the peak intensities) of the semiconductor LED chip emission, is up-converted to 651 nm emission by two individual up-conversion materials.

Figure 3:
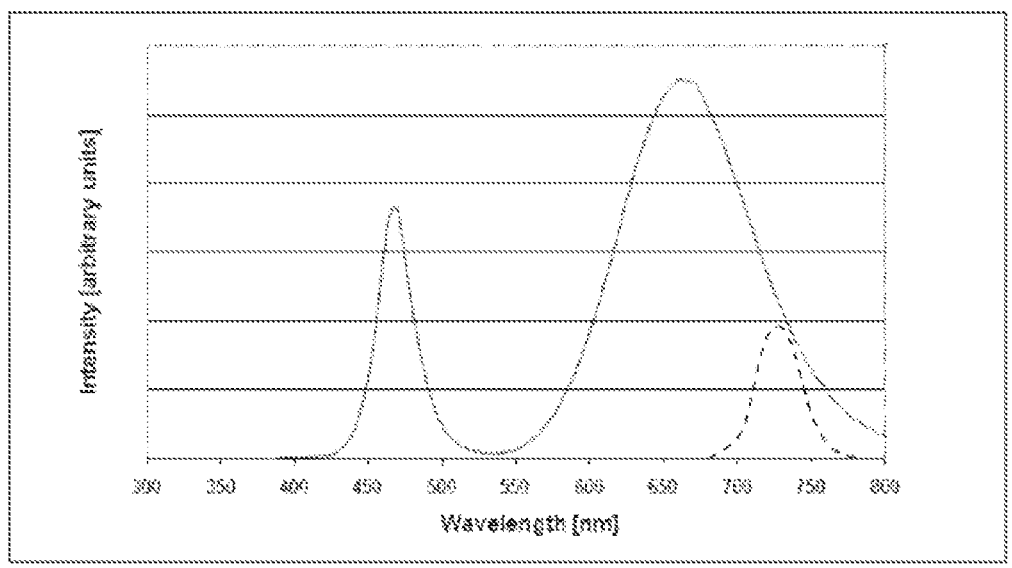
FIG. 3 shows the emission peaks of a second single light emission source LED device according to the invention.

In FIG. 3, the semiconductor LED chip emission frequency peaks at a wavelength of 470 nm with emission peaks Full Width of Half Maximum (FWHM) of 30 nm. In this case the wavelength up-conversion is done by using two up-conversion materials. These two wavelength up-conversion materials have individual emission peaks at 660 nm and 604 nm. FIG. 2 shows the combined emission peak from these two wavelength up-conversion materials peaking at 660 nm wavelength with emission peaks FWHM of 105 nm. In this case about 60% (calculated from the peak intensities) of the semiconductor LED chip emission, is up-converted to 660 nm emission by two individual "up-conversion" materials. FIG. 3 also shows the peak in the far-red wavelength region.

Figure 4:
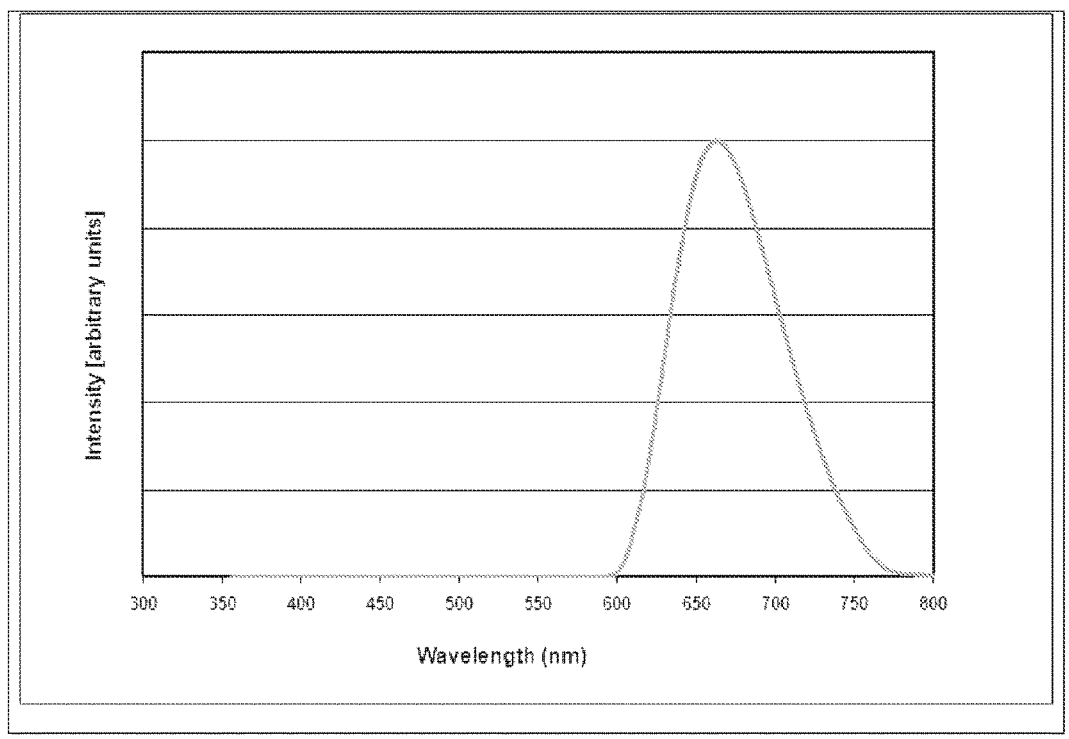
FIG. 4 shows the emission peaks of a third single light emission source LED device according to the invention.

In FIG. 4, the semiconductor LED chip emission frequency peaks at a wavelength of 452 nm with emission peaks Full Width of Half Maximum (FWHM) of 25 nm (not shown in the figure). In this case the wavelength up-conversion is done by using one up-conversion material. FIG. 3 shows the emission peak from this up-conversion material peaking at 658 nm wavelength with emission peaks FWHM of 80 nm. In this case about 100% (calculated from the peak intensities) of the semiconductor LED chip emission, is up-converted to 658 nm emission by the up-conversion material. This can be noticed from the FIG. 4, as there are no 452 nm emission exiting the LED device.

Figure 5:
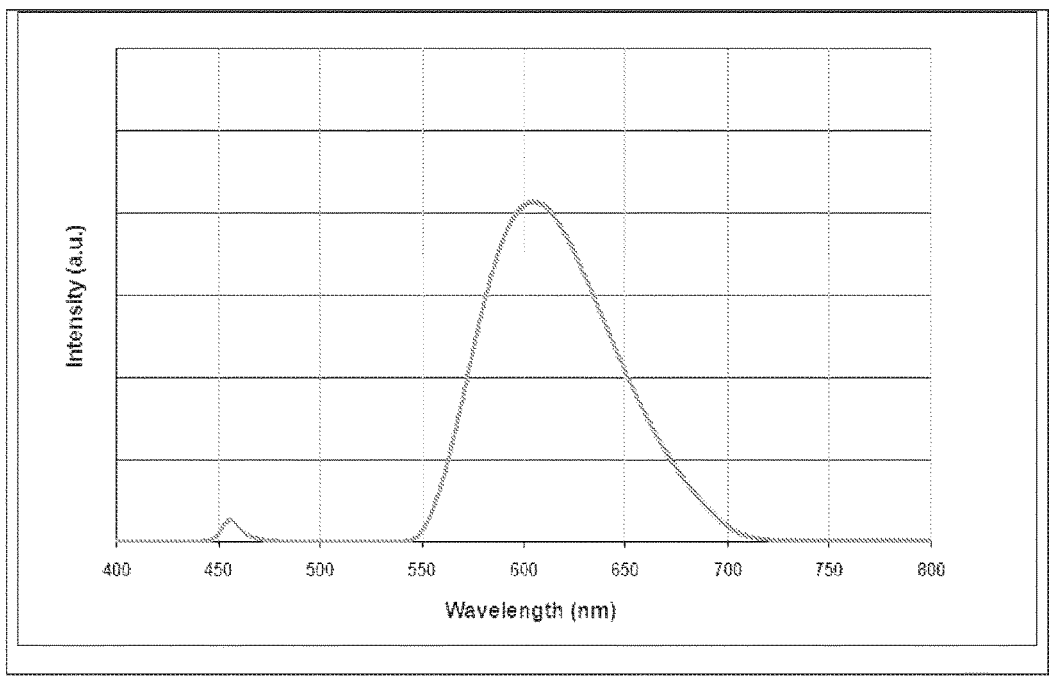
FIG. 5 shows the emission peaks of a fourth single light emission source LED device according to the invention.

In FIG. 5, the semiconductor LED chip emission frequency peaks at a wavelength of 452 nm wavelength with emission peaks Full Width of Half Maximum (FWHM) of 25 nm. In this case the wavelength up-conversion is done by using one up-conversion material. FIG. 5 shows the emission peak from this up-conversion material peaking at 602 nm wavelength with emission peaks FWHM of 78 nm. In this case about 95% (calculated from the peak intensities) of the semiconductor LED chip emission, is up-converted to 602 nm emission by the wavelength up-conversion material.

For the above mentioned spectrum the device can be constructed as explained in details below. The semiconductor LED chip emission frequency should be selected the way that it is suitable for exciting the used phosphor molecules in the device. The emission from the LED chip can be between 400 nm and 470 nm.

The used phosphor molecule or molecules should be selected the way that a desired emission spectra from the LED is achieved.

In the following we will describe a procedure for using two phosphor materials (wavelength up-conversion materials) in the LED device to achieve the desired spectra (cf. FIGS. 6a to 6c).

Figure 6A:
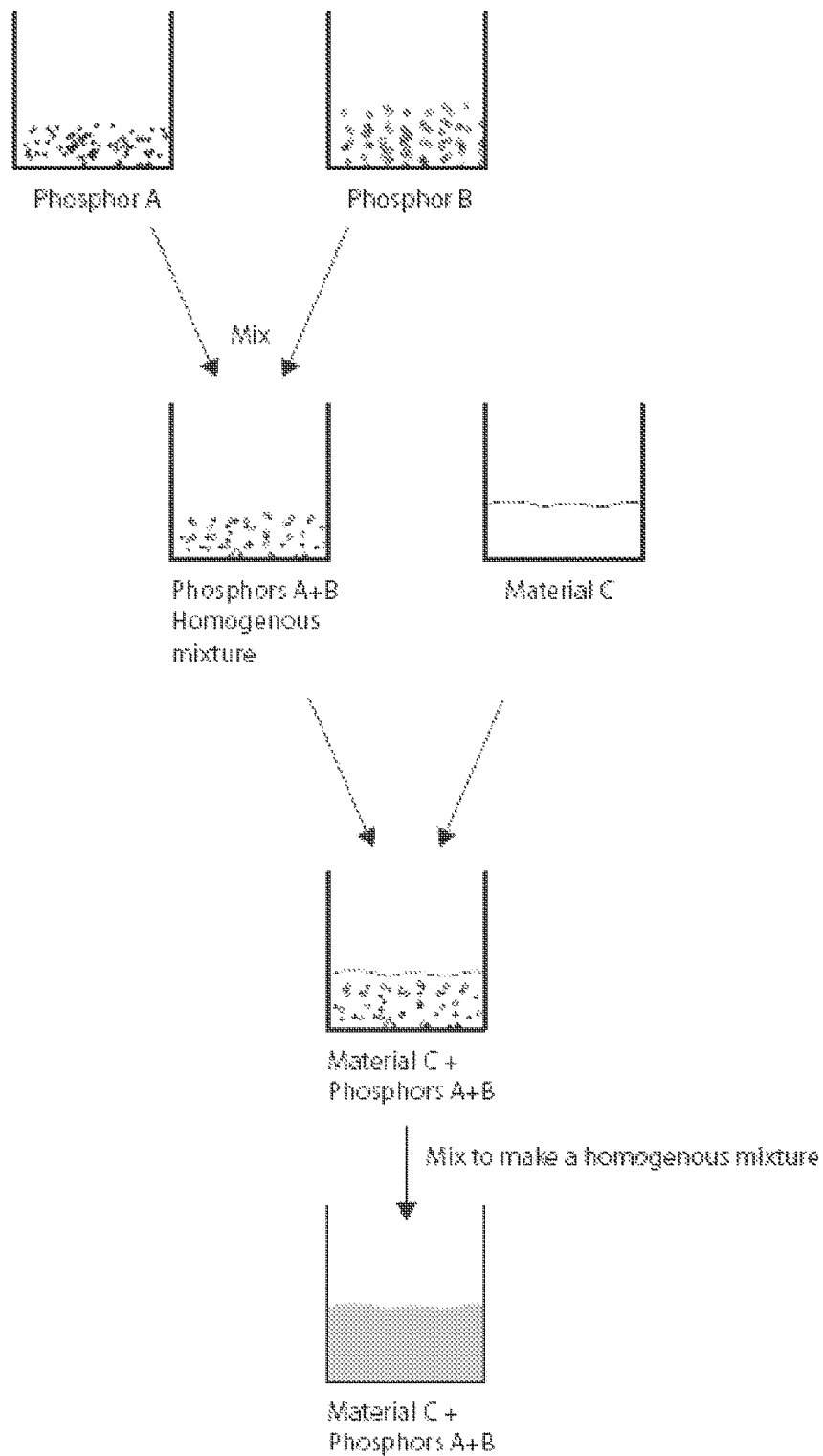
FIGS. 6a to 6c show in a schematical fashion the various process steps of a method of producing a modified LED device according to a preferred embodiment of the invention.
Figure 6B:
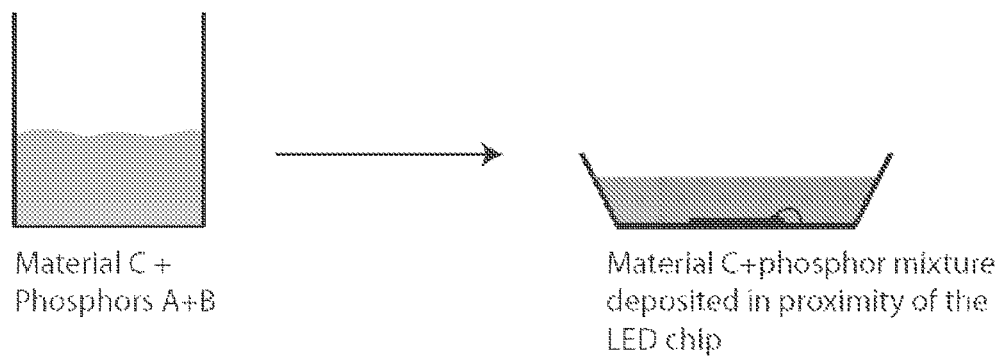
Figure 6C:

Phosphor A and Phosphor B are mixed in a pre-determined ratio to achieve desired phosphor emission spectra from the LED device (cf. FIG. 6a). The ratio of the phosphors can be for example 99:1 (A:B) to 1:99. This mixture of phosphors A+B is mixed into a material C (for example a polymer) at a pre-determined concentration to form an "encapsulant". The concentration of the phosphors in material C can be for example 99:1 (phosphor mixture:material C) to 1:99. This mixture of material C+phosphors (A and B) is then deposited in direct proximity of the LED chip (FIGS. 6b and 6c). By "proximity" we mean it can be deposited directly on the surface of the LED chip or spaced out with other optical material. The concentration of the phosphor mixture in material C determines the wavelength up-conversion amount of the semiconductor LED chip emission frequency, meaning how much of the "original" LED chip emission frequency is seen in the final LED device emission and how much is converted into the phosphor emission in the LED device.

The thickness of the encapsulant (into which the phosphor is mixed) typically varies from 0.1 um to 20 mm, in particular 1 um to 10 mm, preferably 5 um to 10 mm, for example about 10 um to 5 mm, depending on the concentration of the phosphor.

Typically the concentration of the phosphor (calculated from the total weight of the encapsulant) is about 0.1 to 20%, preferably about 1 to 10%.

The wavelength up-conversion can be 100%, meaning that there is only phosphor emission seen from the LED device or it can be less than 100%, meaning that some of the LED chip emission is transmitted out from the LED device.

To summarize, by tuning the phosphor ratio A:B it is possible to tune the desired phosphor emission spectra from the LED device and by tuning the phosphor concentration in material C it is possible to tune the desired LED chip emission quantity/amount for the LED device.

The amount (physical thickness) of material C (with certain phosphor concentration) on top of the LED chip also affects the amount of LED chip emission transmitting from the LED device. The thicker the material C layer on top of the LED chip, the lower the transmission.

Material C can be for example a solvent, inorganic or organic polymer, silicon polymer, siloxane polymer or other polymer where the phosphor can be mixed into. Material C can have one or more components that have to be mixed prior to usage together with the phosphor. Material C can be a thermally or UV curable material.

The mixture of the phosphor(s) and the solvent material C (solid or liquid) can be translucent or transparent, preferably transparent, to allow for passage of the light emitted from the LED.

In one embodiment that is especially preferable the far red radiation (700-800 nm) is produced by for example europium-cerium co-doped $Ba\_x\ Sr\_y\ ZnS\_3$ phosphors and/or cerium doped lanthanide oxide sulfides. These phosphor and sulfide types have emission peak maxima between 650-700 nm wavelength region and exhibit also broad (50-200 nm) full width of half maximum and therefore also produce light emission at higher wavelength, i.e., above 700 nm wavelength range.

In addition to or as an alternative to using phosphors or other similar materials it is also possible to realize the wavelength up-conversion by means of at least one semiconductor quantum dot or the like, which is placed near the LED.

EXAMPLE

A LED lighting fixture was constructed for comparison testing purposes based on the single LED device having identical output spectrum of the FIG. 3. The lighting fixture consisted of 60 individual LED units having a power consumption of 69 W which includes the power consumption of the AC/DC constant current driver.

The comparison devices were commercial HPS (High Pressure Sodium) lamp greenhouse lighting fixture with total power consumption of 420 W and commercial LED greenhouse LED fixture. The commercial LED fixture was based on individual blue and red LED devices having total power consumption of 24 W.

The LED lighting fixture according to the present invention was tested against the above-mentioned commercial LED devices using following PPF measurement procedure and arrangement.

PAR irradiance (irradiance value between 400 nm and 700 nm) and PPF-values were calculated by measuring the light fixture spectra from 300 nm to 800 nm and absolute irradiance value at band from 385 nm to 715 nm. The spectrum of each lamp were measured with ILT700A spectroradiometer at one distance. The absolute irradiance-values were measured with precision pyranometer at certain distances and were later used to calculate the absolute spectra to these distances. These absolute spectra were used to calculate PAR- and PPF calculations. PAR-irradiance ($W/m^2$) was calculated by integrating the absolute spectrum from 400 nm to 700 nm PPF-values were calculated by first translating the irradiance value of each "channel" of the spectrum from W/m² to microeinsteins and then integrating this spectrum over the desired wavelength band.

The comparison result of these two commercial greenhouse lamp fixtures and the LED fixture according to the innovation are presented in the table below. The results are also normalized against the commercial HPS lighting fixture.

| Type | HPS | Ref. Grow LED | LED of Invention |
|---|---|---|---|
| Power (W) | 420 | 24 | 69 |
| Total PPF | 164 | 26 | 88 |
| PPF/Watt | 0.39 | 1.08 | 1.28 |
| PPF efficiency normalized to Ref. HPS | 1 | 2.77 | 3.27 |
| PPF efficiency normalized to Ref. HPS (%) | 100% | 277% | 327% |

As will appear from the test results shown, an LED lighting fixture according to the present invention provides 3.27 times higher PPF efficiency compared to HPS and 1.18 times better PPF efficiency compared to commercial LED greenhouse fixture based on individual blue and red LED devices. Naturally all of the LEDs or lighting fixtures are arranged to be used especially in greenhouses for plant cultivation as greenhouse lights in many embodiments of the invention.

The above examples have described embodiments in which there is one Light Emitting Diode (LED) having the indicated spectral characteristics. Naturally, the present lighting fixtures may comprise a plurality of LEDs, at least some (say 10% or more) or preferably a majority (more than 50%) of which have the indicated properties and characteristics. It is therefore possible to have fixtures comprising combinations of conventional LEDs and LEDs of the present kind. There are no particular upper limits to the number of LEDs. Thus, lighting fixtures of the present kind can have roughly 1 up to 10,000 LEDs, typically 1 to 1000 LEDs, in particular 1 to 100 LEDs.

It is in accordance with the invention to include LEDs with different peak emissions in one luminaire and to control these in order to provide a desirable spectral emission to achieve a determined growth result or physiological response. In this way, the lighting system would allow a versatile control of lighting intensity and spectrum. Ultimately, the control of other abiotic parameters such as $CO_2$ concentration, temperature, daylight availability and humidity could be integrated within the same control system together with lighting, optimizing the crop productivity and the overall management of the greenhouse.

REFERENCES

EP 2056364 A1, Satou et al.
US 2009/0231832, Zukauskas et al.

The invention claimed is:
1. A horticultural lighting fixture comprising:
only two light emitting diode (LED) groups including:
a first LED group comprising at least one LED, the first LED group exhibiting
main spectral characteristics in the photosynthetically active radiation (PAR) (400-700 nm) area, and
a second LED group comprising at least one LED, the second LED group exhibiting
at least one side spectral characteristics comprising a spectral peak having its peak wavelength in the 700-800 nm area,
wherein all spectral peaks exhibited by the first LED group have peak wavelengths below 700 nm and all spectral peaks exhibited by the second LED group have peak wavelengths above 700 nm, and
wherein intensities of emissions of the first LED group and the second LED group are independently adjustable during use.

2. The horticultural lighting fixture according to claim 1, further comprising at least one electronic control system to switch the first LED group and the second LED group independently on and off or alternatively dim independently by 0-100% power.

3. The horticultural lighting fixture according to claim 1, wherein the main spectral characteristics comprise at least one peak coinciding with an absorption peak of photoreceptors of a plant.

4. The horticultural lighting fixture according to claim 3, wherein the main spectral characteristics comprise at least two peaks matching carotenoid and chlorophyll absorption peaks.

5. The horticultural lighting fixture according to claim 4, wherein the main spectral characteristics comprise
first main spectral characteristics including a peak in the wavelength range from 600 to 700 nm and arranged to exhibit a full width of half maximum of at least 50 nm or more, and
second main spectral characteristics with a maximum of 50 nm full width of half maximum and arranged to exhibit a peak wavelength in the range from 440 to 500 nm.

6. The horticultural lighting fixture according to claim 5, wherein at least a part or the whole of the emission at wavelengths of 500-600 nm is minimized and/or omitted and/or reduced below the intensity in the 400-500 nm band and below the intensity in the 600-700 nm band.

7. The horticultural lighting fixture according to claim 1, wherein all or part of the emission of the first LED group or the second LED group at a frequency of 600-800 nm is generated using a whole or partial wavelength up-conversion of LED chip radiation power.

8. The horticultural lighting fixture according to claim 7, wherein the wavelength up-conversion is generated with at least two up-conversion materials, and
the main spectral characteristics and the at least one side spectral characteristics are generated with different sets of up-conversion materials.

9. The horticultural lighting fixture according to claim 8, wherein the main spectral characteristics comprise at least two peaks coinciding with an absorption peak of photoreceptors of a plant, the main spectral characteristics including a peak in the blue wavelength region and a peak in the red wavelength region, the peak in the blue wavelength region being generated with a primary emission of the at least one LED.

10. The horticultural lighting fixture according to claim 1, wherein all or part of the emission of the first LED group or the second LED group at a frequency of 600-800 nm is generated using a whole or partial wavelength up-conversion of LED chip radiation power, the wavelength up-conversion being generated with at least two up-conversion materials.

11. The horticultural lighting fixture according to claim 10, wherein the main spectral characteristics comprise at least two peaks coinciding with absorption peaks of photoreceptors of a plant, the main spectral characteristics including a peak in the blue wavelength region and a peak in the red wavelength region, the peak in the blue wavelength region being generated with a primary emission of the at least one LED.

12. A cultivation space in a form of a greenhouse or a growth room, the cultivation space comprising:
   the at least one horticultural lighting fixture according to claim 1,
   wherein the cultivation space is configured to cultivate plants.

* * * * *